(12) United States Patent
Komine et al.

(10) Patent No.: US 9,577,574 B2
(45) Date of Patent: Feb. 21, 2017

(54) RESONATOR, RESONATOR DEVICE, OSCILLATOR, ELECTRONIC APPARATUS, AND MOVING OBJECT

(71) Applicant: Seiko Epson Corporation, Tokyo (JP)

(72) Inventors: Kenji Komine, Chigasaki (JP); Go Yamashita, Ina (JP); Takumi Suzuki, Minowa (JP); Wataru Ikegami, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/017,938

(22) Filed: Feb. 8, 2016

(65) Prior Publication Data
US 2016/0241188 A1    Aug. 18, 2016

(30) Foreign Application Priority Data

Feb. 17, 2015    (JP) .................................. 2015-028432

(51) Int. Cl.
*H03B 5/32*    (2006.01)
*H01L 41/053*   (2006.01)
(Continued)

(52) U.S. Cl.
CPC .............. *H03B 5/32* (2013.01); *H01L 41/053* (2013.01); *H01L 41/094* (2013.01);
(Continued)

(58) Field of Classification Search
CPC .. H01L 41/047; H01L 41/053; H01L 41/0906; H01L 41/0913; H01L 41/094; H01L 41/0986; H01L 41/0993; H03B 5/04; H03B 5/30; H03B 5/32; H03H 9/0538; H03H 9/10; H03H 9/15; H03H 9/17; H03H 9/19; H03L 1/02; H03L 1/028; H03L 1/04
(Continued)

(56) References Cited

U.S. PATENT DOCUMENTS 3,792,294 A * 2/1974 Royer ...................... H03H 9/19
310/361
8,536,761 B2 * 9/2013 Yamashita ........... H03H 9/1021
310/320
(Continued)

FOREIGN PATENT DOCUMENTS

JP    2006-340023 A    12/2006
JP    2012-161108 A    8/2012
(Continued)

*Primary Examiner* — Levi Gannon
(74) *Attorney, Agent, or Firm* — Harness, Dickey & Pierce, P.L.C.

(57) ABSTRACT

A resonator includes: a resonator element including a quartz crystal substrate that includes a first area performing a thickness-shear vibration and a second area with a thickness thinner than the first area and located around the first area; and a base substrate to which the second area of the resonator element on one edge side thereof is attached via a bonding material. The quartz crystal substrate has a major surface that is a surface including an X-axis and a Z'-axis, and has a thickness in a direction along a Y'-axis. The resonator satisfies the relation: $1.5 \times \lambda \leq Xp$ where Xp is the maximum length of an area of the second area where the bonding material is bonded along the X-axis in a plan view and $\lambda$ is the wavelength of a flexural vibration occurring in the quartz crystal substrate.

14 Claims, 14 Drawing Sheets

(51) Int. Cl.
*H03H 9/05* (2006.01)
*H03H 9/19* (2006.01)
*H01L 41/09* (2006.01)

(52) U.S. Cl.
CPC ....... *H01L 41/0913* (2013.01); *H03H 9/0538* (2013.01); *H03H 9/19* (2013.01)

(58) Field of Classification Search
USPC ........ 310/311, 360, 361, 365, 368; 331/154, 331/158, 176
See application file for complete search history.

(56) References Cited

U.S. PATENT DOCUMENTS

| | | | | |
|---|---|---|---|---|
| 2011/0203083 | A1* | 8/2011 | Sasaki | H03H 3/02 29/25.35 |
| 2012/0032563 | A1* | 2/2012 | Shimao | H03H 9/02023 310/344 |
| 2012/0126668 | A1* | 5/2012 | Ii | H03H 3/02 310/357 |
| 2012/0235762 | A1 | 9/2012 | Ii et al. | |
| 2012/0242193 | A1* | 9/2012 | Shimao | H03H 9/19 310/348 |
| 2013/0043771 | A1 | 2/2013 | Sasaki et al. | |
| 2013/0241359 | A1* | 9/2013 | Naito | H01L 41/053 310/348 |
| 2013/0249353 | A1* | 9/2013 | Naito | H01L 41/0825 310/367 |
| 2013/0335157 | A1* | 12/2013 | Ishii | H01L 41/0475 331/158 |

FOREIGN PATENT DOCUMENTS

| | | |
|---|---|---|
| JP | 2012-199602 A | 10/2012 |
| JP | 2013-042396 A | 2/2013 |
| JP | 2014-075848 A | 4/2014 |

* cited by examiner

RESONATOR, RESONATOR DEVICE, OSCILLATOR, ELECTRONIC APPARATUS, AND MOVING OBJECT

BACKGROUND

1. Technical Field

The present invention relates to a resonator, a resonator device, an oscillator, an electronic apparatus, and a moving object.

2. Related Art

Heretofore, resonator elements using quartz crystal have been known. Such resonator elements have excellent frequency-temperature characteristics, and thus are widely used as a reference frequency source, an oscillation source, or the like for various types of electronic apparatuses. Especially a resonator element using a quartz crystal substrate that is cut at a cut angle called the AT cut has frequency-temperature characteristics showing a cubic curve, and thus is widely used also for mobile communication apparatuses and the like such as a mobile phone.

For example, JP-A-2012-199602 discloses a resonator in which a resonator element having a mesa structure is attached to a package via a conductive adhesive.

In the resonator described above, however, a flexural vibration (unwanted vibration) constituting a factor of spurious may occur in the quartz crystal substrate depending on the bonding conditions (e.g., the size of the bonding material, etc.) of the conductive adhesive (bonding material). This may degrade temperature characteristics of the resonance frequency (frequency-temperature characteristics) of the resonator element or increase the equivalent series resistance (CI (Crystal Impedance) value) thereof.

SUMMARY

An advantage according to some aspects of the invention is to provide a resonator capable of attenuating the amplitude of a flexural vibration. Another advantage according to some aspects of the invention is to provide a resonator device, an oscillator, an electronic apparatus, and a moving object, all of which include the resonator.

The invention can be implemented as the following forms or application examples.

Application Example 1

A resonator according to this application example includes: a resonator element including a quartz crystal substrate that includes a first area performing a thickness-shear vibration and a second area with a thickness thinner than the first area and located around the first area; and a base substrate to which the second area of the resonator element on one edge side thereof is attached via a bonding material, wherein, in an orthogonal coordinate system composed of an X-axis as an electrical axis, a Y-axis as a mechanical axis, and a Z-axis as an optic axis that are crystal axes of quartz crystal, the quartz crystal substrate has a Z'-axis that is an axis obtained by inclining the Z-axis such that a +Z-side thereof rotates about the X-axis toward a −Y-direction of the Y-axis, a Y'-axis that is an axis obtained by inclining the Y-axis such that a +Y-side thereof rotates about the X-axis toward a +Z-direction of the Z-axis, a major surface that is a surface including the X-axis and the Z'-axis, and a thickness in a direction along the Y'-axis, and the resonator satisfies the relation: $1.5 \times \lambda \leq Xp$ where $Xp$ is the maximum length of an area of the second area where the bonding material is bonded along the X-axis in a plan view and $\lambda$ is the wavelength of a flexural vibration occurring in the quartz crystal substrate.

In the resonator, the amplitude of the flexural vibration can be attenuated.

Application Example 2

In the resonator according to the application example, the resonator may satisfy the relation: $2 \times \lambda \leq Xp$.

In the resonator with this configuration, the amplitude of the flexural vibration can be attenuated.

Application Example 3

In the resonator according to the application example, the resonator may satisfy the relation: $\lambda/2 \leq Lx$ where $Lx$ is the minimum length along the X-axis between an edge of the area of the second area where the bonding material is bonded on the first area side and an edge of the first area on the bonding material side in the plan view.

In the resonator with this configuration, it is possible to reduce a reduction in the amplitude of the thickness-shear vibration of the resonator element due to the bonding material.

Application Example 4

In the resonator according to the application example, the first area may include a first portion, and a second portion with a thickness thinner than the first portion and located between the first portion and the second area at least in a direction along the X-axis in the plan view.

In the resonator with this configuration, energy of the thickness-shear vibration can be trapped in the first area.

Application Example 5

In the resonator according to the application example, the resonator may further include an excitation electrode disposed in the first area.

In the resonator with this configuration, the quartz crystal substrate can be excited by the excitation electrode.

Application Example 6

A resonator device according to this application example includes: the resonator according to the application example; and an electronic element.

The resonator device includes the resonator according to the application example, and thus can have favorable temperature characteristics.

Application Example 7

In the resonator device according to the application example, the electronic element may be a temperature-sensitive element.

The resonator device with this configuration includes the resonator according to the application example, and thus can have favorable temperature characteristics.

Application Example 8

An oscillator according to this application example includes: the resonator according to the application example; and an oscillation circuit electrically connected with the resonator.

The oscillator includes the resonator according to the application example, and thus can have favorable temperature characteristics.

Application Example 9

An electronic apparatus according to this application example includes the resonator according to the application example.

The electronic apparatus includes the resonator according to the application example, and thus can have favorable temperature characteristics.

Application Example 10

A moving object according to this application example includes the resonator according to the application example.

The moving object includes the resonator according to the application example, and thus can have favorable temperature characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below do not unduly limit the contents of the invention set forth in the appended claims. Moreover, not all of the configurations described below are indispensable configuration requirements of the invention.

1. RESONATOR

Figure 1:
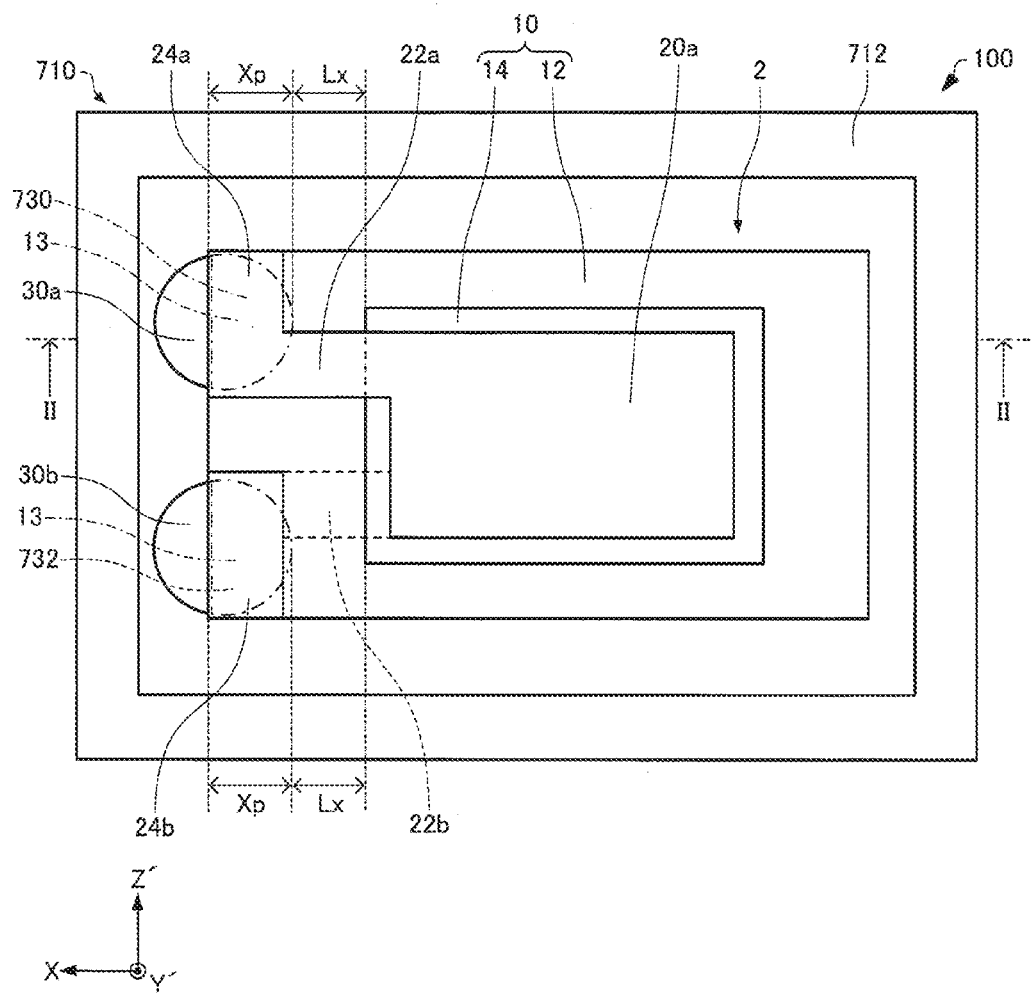
FIG. 1 is a plan view schematically showing a resonator according to an embodiment.
Figure 2:
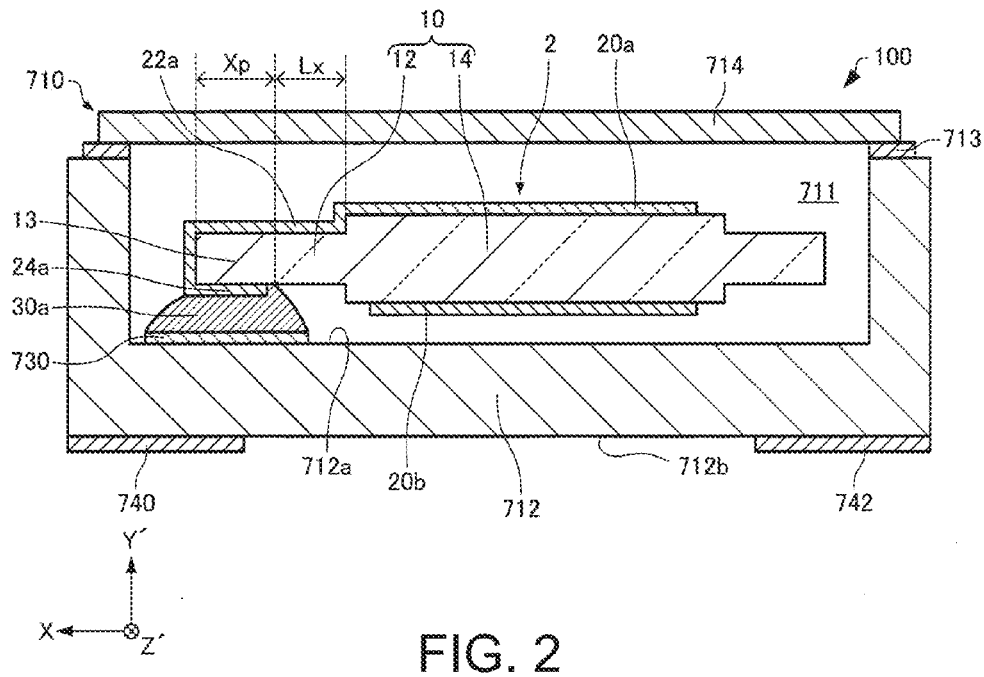
FIG. 2 is a cross-sectional view schematically showing the resonator according to the embodiment.

First, a resonator according to an embodiment will be described with reference to the drawings. FIG. 1 is a plan view schematically showing the resonator 100 according to the embodiment. FIG. 2 is a cross-sectional view schematically showing the resonator 100 according to the embodiment, taken along the line II-II in FIG. 1.

Figure 3:
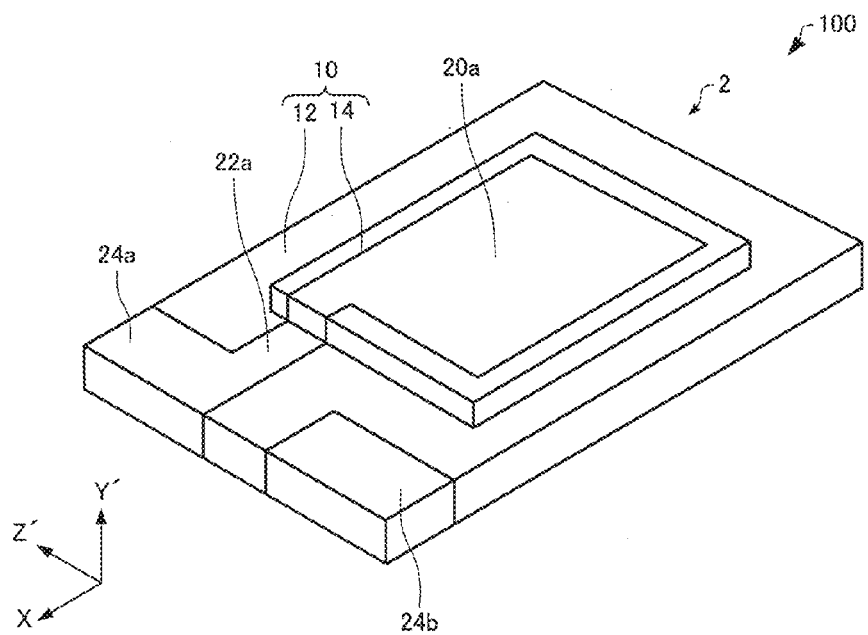
FIG. 3 is a perspective view schematically showing a resonator element of the resonator according to the embodiment.

As shown in FIGS. 1 and 2, the resonator 100 includes a resonator element 2, bonding materials 30a and 30b, and a package 710. FIG. 3 is a perspective view schematically showing the resonator element 2. As shown in FIGS. 1 to 3, the resonator element 2 includes a quartz crystal substrate 10, excitation electrodes 20a and 20b, lead electrodes 22a and 22b, and electrode pads 24a and 24b.

Figure 4:
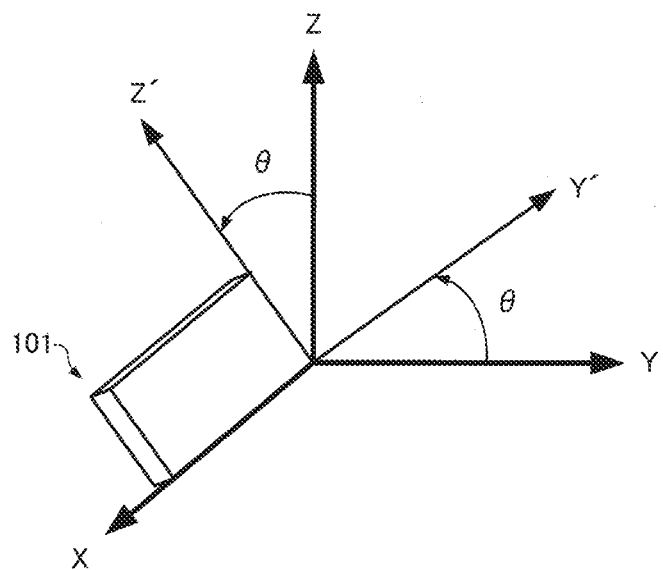
FIG. 4 is a perspective view schematically showing an AT-cut quartz crystal substrate.

The quartz crystal substrate 10 is composed of an AT-cut quartz crystal substrate. FIG. 4 is a perspective view schematically showing an AT-cut quartz crystal substrate 101.

A piezoelectric material such as quartz crystal generally belongs to the trigonal system and has crystal axes (X, Y, and Z) as shown in FIG. 4. The X-axis is an electrical axis; the Y-axis is a mechanical axis; and the Z-axis is an optic axis. The quartz crystal substrate 101 is a plate of what is called the rotated Y-cut quartz crystal substrate, which is cut from a piezoelectric material (e.g., a synthetic quartz crystal) along a plane obtained by rotating the XZ plane (plane including the X-axis and the Z-axis) about the X-axis by an angle θ. The Y-axis and the Z-axis are also rotated about the X-axis by θ, which are referred to as a Y'-axis and a Z'-axis, respectively. The quartz crystal substrate 101 is a substrate having a major surface in a plane including the X-axis and the Z'-axis, and having a thickness in a direction along the Y'-axis. Here, when θ=35° 15', the quartz crystal substrate 101 is an AT-cut quartz crystal substrate. Hence, the AT-cut quartz crystal substrate 101 has a major surface (a major surface of a vibrating portion) that is an XZ' surface (surface including the X-axis and the Z'-axis) orthogonal to the Y'-axis, and can vibrate with a thickness-shear vibration as a primary vibration. The quartz crystal substrate 10 can be obtained by processing the AT-cut quartz crystal substrate 101.

As shown in FIG. 4, the quartz crystal substrate 10 is composed of the AT-cut quartz crystal substrate having, in an orthogonal coordinate system composed of the X-axis as an electrical axis, the Y-axis as a mechanical axis, and the Z-axis as an optic axis that are the crystal axes of quartz crystal, the Z'-axis that is an axis obtained by inclining the Z-axis such that a +Z-side thereof rotates about the X-axis toward a −Y-direction of the Y-axis, the Y'-axis that is an axis obtained by inclining the Y-axis such that a +Y-side thereof rotates about the X-axis toward a +Z-direction of the Z-axis, a major surface that is a surface including the X-axis and the Z'-axis, and a thickness in a direction along the Y'-axis. In FIGS. 1 to 3, the X-axis, the Y'-axis, and the Z'-axis orthogonal to one another are illustrated.

As shown in FIG. 1, the quartz crystal substrate 10 has, for example, a thickness direction in a direction along the Y'-axis (Y'-axis direction), and a rectangular shape with long sides in a direction along the X-axis (X-axis direction) and short sides in a direction along the Z'-axis (Z'-axis direction) in a plan view in the Y'-axis direction (hereinafter also referred to simply as "in the plan view"). The quartz crystal substrate 10 includes a peripheral portion (second area) 12 and a vibrating portion (first area) 14.

As shown in FIG. 1, the peripheral portion 12 is provided around the vibrating portion 14. The peripheral portion 12 is provided along the outer edge of the vibrating portion 14. The peripheral portion 12 has a thickness smaller than the vibrating portion 14 (the thickness is thinner than the vibrating portion 14). The peripheral portion 12 is integrated with the outer edge of the first area 14.

The vibrating portion 14 is surrounded by the peripheral portion 12 in the plan view, and has a thickness greater than the peripheral portion 12. The quartz crystal substrate 10 includes two kinds of portions with different thicknesses as described above, so that it can be said that the resonator element 2 has a mesa structure (in the illustrated example, a one-stage mesa structure). The vibrating portion 14 has sides along the X-axis and sides along the Z'-axis. Specifically, the vibrating portion 14 has a rectangular shape with long sides in the X-axis direction and short sides in the Z'-axis direction in the plan view.

The vibrating portion 14 can vibrate with the thickness-shear vibration as a primary vibration. The resonator element 2 has a mesa structure, and thus can have an energy trapping effect. The "thickness-shear vibration" means a vibration in which the displacement direction of the quartz crystal substrate is parallel to the major surface of the quartz crystal substrate (in the illustrated example, the displacement direction of the quartz crystal substrate is the X-axis direction) and the wave propagation direction is the thickness direction of the quartz crystal substrate.

The first excitation electrode 20a and the second excitation electrode 20b are provided so as to overlap the vibrating portion 14 in the plan view. The plan-view shape (shape viewed in the Y'-axis direction) of the excitation electrodes 20a and 20b is, for example, rectangular. The excitation electrodes 20a and 20b are provided inside the outer edge of the vibrating portion 14 in the plan view. That is, in the plan view, the area of the excitation electrodes 20a and 20b is smaller than the area of the vibrating portion 14. The excitation electrodes 20a and 20b are electrodes for applying a voltage to the vibrating portion 14.

The first excitation electrode 20a is connected with the first electrode pad 24a via the first lead electrode 22a. The second excitation electrode 20b is connected with the second electrode pad 24b via the second lead electrode 22b. The electrode pads 24a and 24b are electrically connected with, for example, an IC chip (not shown) for driving the resonator element 2. The electrode pads 24a and 24b are provided on the +X-axis direction side of the peripheral portion 12. As the excitation electrodes 20a and 20b, the lead electrodes 22a and 22b, and the electrode pads 24a and 24b (hereinafter also referred to as "excitation electrodes 20a and 20b and the like"), for example, one obtained by stacking chromium and gold in this order from the quartz crystal substrate 10 side is used.

The first bonding material 30a and the second bonding material 30b bond the resonator element 2 and the package 710 together. The bonding materials 30a and 30b overlap, for example, the edge of the quartz crystal substrate 10 on the +X-axis direction side in the plan view. In the illustrated example, the plan-view shape of the bonding materials 30a and 30b is, for example, a circle, an ellipse, a polygon, or the like, and is not particularly limited.

The first bonding material 30a is connected with the first electrode pad 24a. The second bonding material 30b is connected with the second electrode pad 24b. In the example shown in FIG. 2, the first bonding material 30a is in contact with the first electrode pad 24a and the peripheral portion 12 of the quartz crystal substrate 10. The second bonding material 30b is in contact with the second electrode pad 24b and the peripheral portion 12. The peripheral portion 12 includes areas 13 overlapping the bonding materials 30a and 30b in the plan view. The areas 13 are areas of the peripheral portion 12 where the bonding materials 30a and 30b are bonded. In the illustrated example, the areas 13 include a portion of the peripheral portion 12 where the first bonding material 30a is bonded via the first electrode pad 24a, a portion of the peripheral portion 12 where the second bonding material 30b is bonded via the second electrode pad 24b, and portions of the peripheral portion 12 where the bonding materials 30a and 30b are directly bonded. In FIG. 1, the areas 13 are shown by dash-dotted lines.

The first bonding material 30a and the second bonding material 30b have conductivity. As the bonding materials 30a and 30b, for example, a silver paste, solder, a conductive adhesive (adhesive obtained by dispersing a conductive filler such as metal particles in a resin material), or the like is used.

The resonator 100 satisfies Formula (1) below and may further satisfy Formula (2) below.

$$1.5 \times \lambda \leq Xp \quad (1)$$

$$2 \times \lambda \leq Xp \quad (2)$$

where Xp is the maximum length of the area 13 of the peripheral portion 12 along the X-axis and $\lambda$ is the wavelength of a flexural vibration occurring in the quartz crystal substrate 10.

By satisfying Formula (1), the amplitude of the flexural vibration can be attenuated in the resonator 100. Therefore, the flexural vibration is less likely to couple to the thickness-shear vibration, the resonator 100 can have favorable frequency-temperature characteristics, and the equivalent series resistance can be reduced (for details, see "Experimental Examples" described later).

Although, in the illustrated example, the maximum length Xp of the area 13 overlapping the first bonding material 30a and the maximum length Xp of the area 13 overlapping the second bonding material 30b are the same as each other in the plan view, the maximum lengths Xp may be different from each other. When the two lengths Xp are different from each other, both the two lengths Xp preferably satisfy Formulae (1) and (2).

The expression "the wavelength of the flexural vibration occurring in the quartz crystal substrate 10" means the wavelength of the flexural vibration as spurious (unwanted vibration) occurring in the quartz crystal substrate 10. For example, the wavelength $\lambda$ [mm] of the flexural vibration can be obtained by Formula (3) below.

$$\lambda/2 = (1.332/f) - 0.0024 \quad (3)$$

where f [MHz] is the resonance frequency of the resonator element 2.

Further, the resonator 100 may satisfy the relation: $Xp \leq 5 \times \lambda$. Due to this, miniaturization can be achieved. Further, the resonator 100 may satisfy the relation: $1.5 \times \lambda \leq Xp \leq 2 \times \lambda$.

Further, the resonator 100 preferably satisfies Formula (4) below.

$$\lambda/2 \leq Lx \quad (4)$$

where Lx is the length along the X-axis between the edge (in the illustrated example, the edge on the −X-axis direction side) of the area 13 on the vibrating portion 14 side and the edge (in the illustrated example, the edge on the +X-axis direction side) of the vibrating portion 14 on the bonding materials 30a and 30b side in the plan view.

By satisfying Formula (4), it is possible in the resonator 100 to reduce a reduction in the amplitude of the thickness-shear vibration of the resonator element 2 due to the bonding materials 30a and 30b (due to the fact that the resonator element 2 is bonded to the package 710 with the bonding materials 30a and 30b).

Although, in the illustrated example, the length Lx between the edge of the area 13 overlapping the first bonding material 30a on the vibrating portion 14 side and the edge of the vibrating portion 14 on the first bonding material 30a side is the same as the length Lx between the edge of the area 13 overlapping the second bonding material 30b on the vibrating portion 14 side and the edge of the vibrating portion 14 on the second bonding material 30b side in the plan view, the lengths Lx may be different from each other. When the two lengths Lx are different from each other, both the two lengths Lx preferably satisfy Formula (4).

As shown in FIG. 2, the package 710 includes a base substrate 712 having a box shape and including a recess 711 that is opened in the upper surface, and a lid 714 having a plate shape and bonded to the base substrate 712 so as to close an opening of the recess 711. The peripheral portion 12 on one edge side (in the illustrated example, the edge on the +X-axis direction side) of the resonator element 2 (the peripheral portion 12 located on the one edge side of the resonator element 2) is attached to the base substrate 712 via the bonding materials 30a and 30b. The package 710 includes an accommodating space formed by closing the recess 711 with the lid 714, and the resonator element 2 is hermetically accommodated and placed in the accommodating space. That is, the resonator element 2 is contained in the package 710.

For example, a reduced-pressure (vacuum) state may be established in the accommodating space (the recess 711) in which the resonator element 2 is contained, or an inert gas such as nitrogen, helium, or argon may be sealed therein. Due to this, the vibration characteristics of the resonator element 2 are improved.

Moreover, the shapes of the base substrate 712 and the lid 714 are not particularly limited as long as the resonator element 2 can be contained. For example, although not illustrated, the package 710 may include a base substrate having a plate shape and a lid having a box shape and including a recess.

The material of the base substrate 712 is, for example, various kinds of ceramics such as aluminum oxide. The material of the lid 714 is, for example, a material having a linear expansion coefficient close to the material of the base substrate 712. Specifically, when the material of the base substrate 712 is ceramics, the material of the lid 714 is an alloy such as Kovar.

The bonding between the base substrate 712 and the lid 714 is performed by providing a seal ring 713 on the base substrate 712, placing the lid 714 on the seal ring 713, and welding the seal ring 713 to the base substrate 712 using, for example, a resistance welding machine. The bonding between the base substrate 712 and the lid 714 is not particularly limited, and may be performed using an adhesive or may be performed by seam welding.

As shown in FIGS. 1 and 2, a first connection terminal 730 and a second connection terminal 732 are provided on an inner bottom surface (surface of the base substrate 712) 712a of the recess 711 of the package 710. The first connection terminal 730 is provided to face the first electrode pad 24a. The second connection terminal 732 is provided to face the second electrode pad 24b. The first connection terminal 730 is electrically connected with the first electrode pad 24a via the first bonding material 30a. The second connection terminal 732 is electrically connected with the second electrode pad 24b via the second bonding material 30b.

A first external terminal 740 and a second external terminal 742 are provided on an outer bottom surface (surface of the base substrate 712 on the side opposite to the inner bottom surface 712a) 712b of the package 710. The first external terminal 740 is electrically connected with the first connection terminal 730 via internal wiring (not shown) penetrating the base substrate 712. The second external terminal 742 is electrically connected with the second connection terminal 732 via the internal wiring. A voltage can be applied to the quartz crystal substrate 10 using the external terminals 740 and 742.

As the connection terminals 730 and 732 and the external terminals 740 and 742, for example, a metal coating obtained by stacking a coating of Ni (nickel), Au (gold), Ag (silver), Cu (copper), or the like on a metallization layer (under layer) of Cr (chromium), W (tungsten), or the like is used.

In a method for manufacturing the resonator 100, for example, an AT-cut quartz crystal substrate is patterned by photolithography and etching to form the quartz crystal substrate 10. The etching may be dry etching or wet etching. Next, the excitation electrodes 20a and 20b and the like are formed on the quartz crystal substrate 10. The excitation electrodes 20a and 20b and the like are formed by, for example, depositing a conductive layer (not shown) by a sputtering method or a vacuum evaporation method, and patterning the conductive layer by photolithography and etching. With the process described above, the resonator element 2 can be manufactured. Next, the resonator element 2 is bonded to the base substrate 712 via the bonding materials 30a and 30b. Next, the lid 714 is bonded to the base substrate 712 via the seal ring 713. With the process described above, the resonator 100 can be manufactured.

The resonator 100 has, for example, the following features.

In the resonator 100, the amplitude of the flexural vibration can be attenuated by satisfying Formula (1). Therefore, the flexural vibration is less likely to couple to the thickness-shear vibration, the resonator 100 can have favorable frequency-temperature characteristics, and the equivalent series resistance can be reduced (for details, see "Experimental Examples" described later). Similarly, the amplitude of the flexural vibration can be attenuated by satisfying Formula (2).

In the resonator 100, it is possible by satisfying Formula (4) to reduce a reduction in the amplitude of the thickness-shear vibration of the resonator element 2 due to the bonding materials 30a and 30b (due to the fact that the resonator element 2 is bonded to the package 710 with the bonding materials 30a and 30b).

Although an example in which the area of the excitation electrodes 20a and 20b is smaller than the area of the vibrating portion 14 in the plan view has been described above, the area of the excitation electrodes 20a and 20b may be greater than the area of the vibrating portion 14 in the plan view in a resonator according to the invention. In this case, the vibrating portion 14 is provided inside the outer edge of the excitation electrodes 20a and 20b in the plan view.

Although the one-stage mesa structure in which the quartz crystal substrate 10 includes the two kinds of portions 12 and 14 with different thicknesses has been described above, the number of stages of the mesa structure of a resonator according to the invention is not particularly limited. For example, a resonator according to the invention may have a two-stage mesa structure in which the vibrating portion includes two kinds of portions with different thicknesses.

Although an example in which the quartz crystal substrate 10 has a rectangular shape in the plan view has been described above, corner portions may be chamfered in the plan view in the quartz crystal substrate 10. That is, the quartz crystal substrate may have a shape in which corner portions of a rectangle are cut.

Although an example in which the vibrating portion 14 has a rectangular shape in the plan view has been described above, corner portions may be chamfered in the plan view in a vibrating portion of a resonator element according to the invention. That is, the vibrating portion may have a shape in which corner portions of a rectangle are cut.

Although an example in which the quartz crystal substrate 10 is an AT-cut quartz crystal substrate has been described above, the quartz crystal substrate is not limited to the AT-cut quartz crystal substrate in a resonator according to the invention. For example, the substrate may be a piezoelectric substrate that vibrates with the thickness-shear vibration, such as an SC-cut quartz crystal substrate or a BT-cut quartz crystal substrate.

2. EXPERIMENTAL EXAMPLES

Experimental examples will be shown below to more specifically describe the invention. The invention is not limited at all by the following experimental examples.

2.1. First Experimental Example

As a first experimental example, resonators like the resonator 100 described above were manufactured. Specifically, resonators using a silver paste as the bonding materials 30a and 30b and having the maximum length Xp of the area 13 of the peripheral portion 12 along the X-axis changed to 1, 1.5, and 2 times the wavelength λ of the flexural vibration were manufactured. The resonance frequency of the resonator element 2 was designed to be 26 MHz. Fifty resonators were manufactured for each length Xp, and the resonance frequency variation value and CI value of the resonator element 2 were measured while changing the ambient temperature (operating temperature). The resonance frequency and CI value of the resonator element 2 were measured using a network analyzer. The wavelength λ of the flexural vibration was calculated based on Formula (4) described above.

Figure 5A:
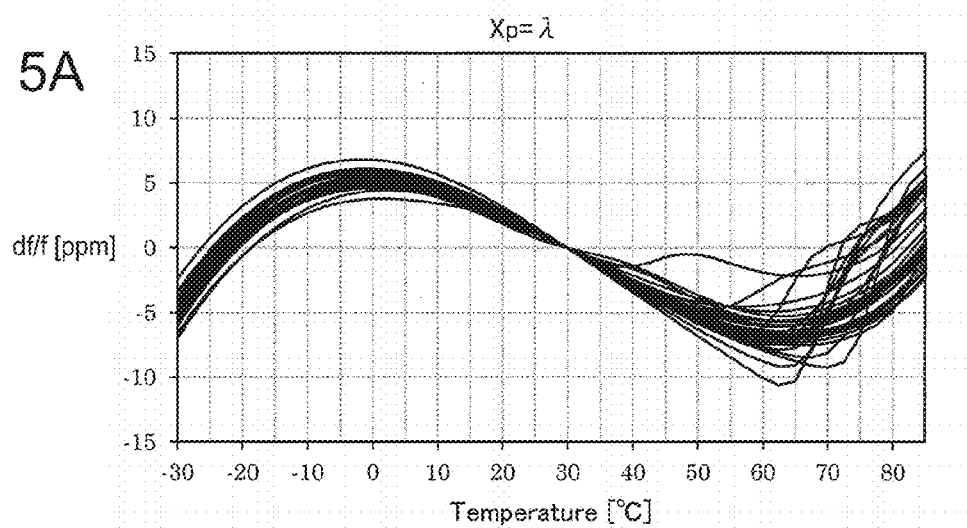
FIGS. 5A and 5B are graphs showing the resonance frequency variation value and the CI value with respect to temperature.
Figure 5B:
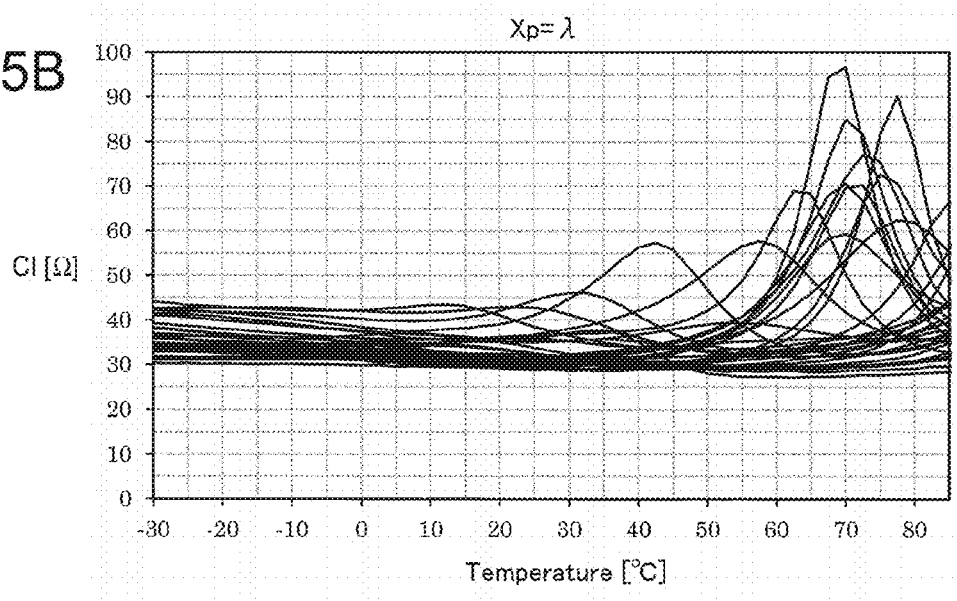
Figure 6A:
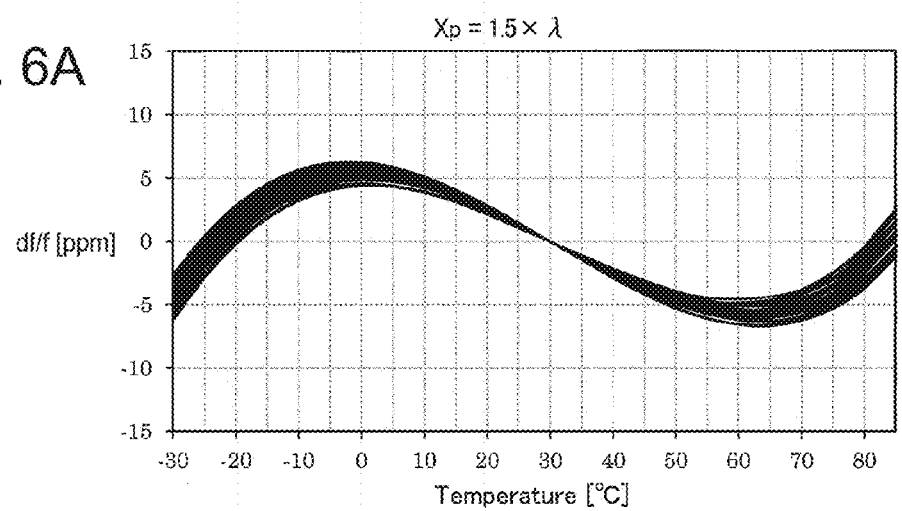
FIGS. 6A and 6B are graphs showing the resonance frequency variation value and the CI value with respect to temperature.
Figure 6B:
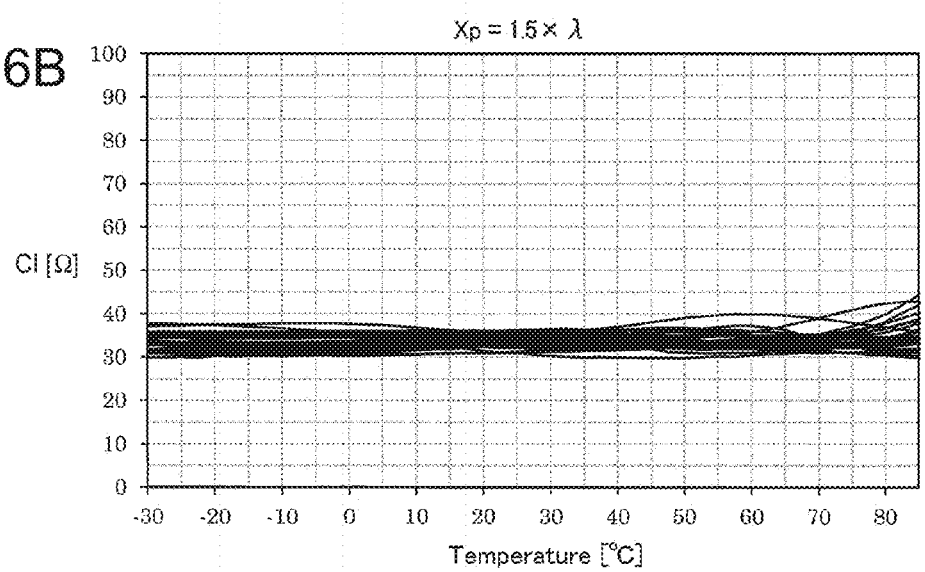
Figure 7A:
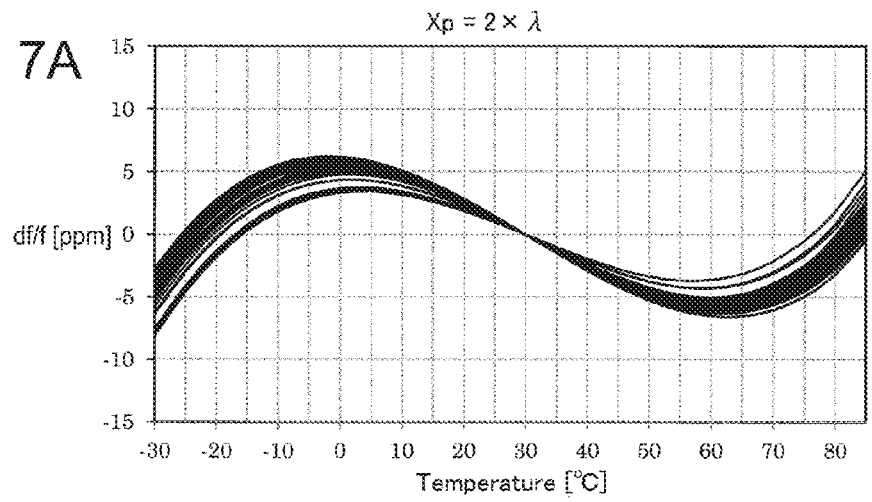
FIGS. 7A and 7B are graphs showing the resonance frequency variation value and the CI value with respect to temperature.
Figure 7B:
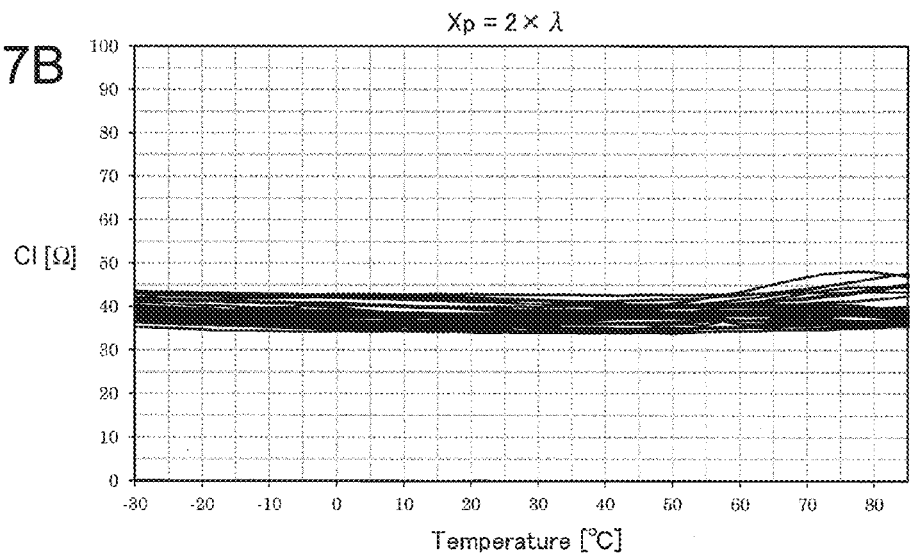

FIGS. 5A and 5B show experimental results of resonators having the length Xp=λ (resonators according to a reference example). FIGS. 6A and 6B show experimental results of resonators having the length Xp=1.5×λ (resonators according to a first example). FIGS. 7A and 7B show experimental results of resonators having the length Xp=2×λ (resonators according to a second example). In FIGS. 5A to 7B, FIGS. 5A, 6A, and 7A show differences between the resonance frequency at each temperature and the resonance frequency at 30° C., while FIGS. 5B, 6B, and 7B show the CI value at each temperature.

As shown in FIGS. 5A and 5B, in the resonators having the length Xp=λ, the variations in resonance frequency were large on the high-temperature side, and the CI value was high. This is because the flexural vibration couples to the thickness-shear vibration. As shown in FIGS. 6A to 7B, on the other hand, in the resonators having the length Xp=1.5×λ and the resonators having the length Xp=2×λ, variations in resonance frequency and increases in CI value were not confirmed on the high-temperature side. It has been found as shown in FIGS. 5A to 7B that the resonators having the length Xp=1.5×λ and the resonators having the length Xp=2×λ have small variations in resonance frequency variations, low CI values, and small variations in CI value compared with the resonators having the length Xp=λ.

Hence, it has been found that, by satisfying Formulae (1) and (2) described above, the resonator can have favorable frequency-temperature characteristics and the equivalent series resistance can be reduced.

2.2. Second Experimental Example

Figure 8A:
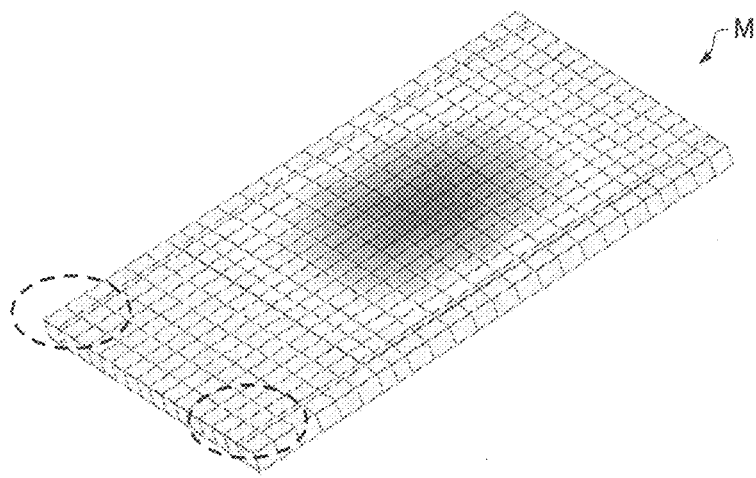
FIGS. 8A and 8B show simulation results showing a thickness-shear vibration mode and a flexural vibration mode.
Figure 8B:
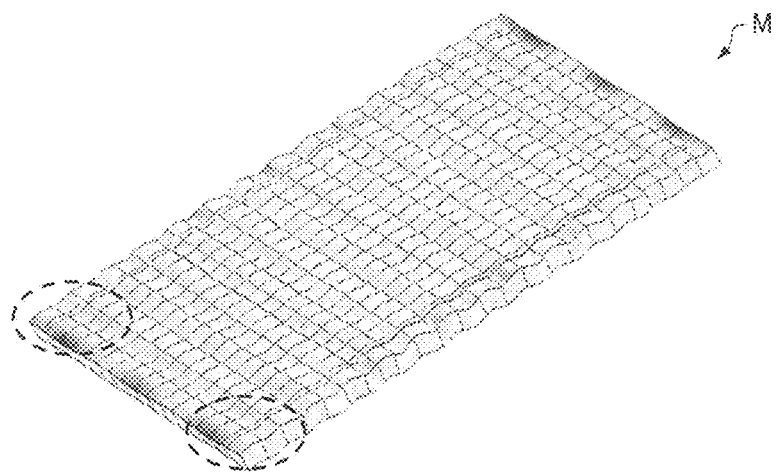

As a second experimental example, simulations were performed using finite element analysis for a model M of a resonator element having a one-stage mesa structure (including a vibrating portion and a peripheral portion thinner than the vibrating portion), and a charge distribution (i.e., vibration energy) in a thickness-shear vibration mode and a charge distribution in a flexural vibration mode were calculated. FIGS. 8A and 8B show simulation results showing the charge distributions of the model M, in which FIG. 8A shows the thickness-shear vibration mode and FIG. 8B shows the flexural vibration mode.

As shown in FIG. 8A, in the thickness-shear vibration mode, the central portion of the resonator element is dark in color while the peripheral portion is light in color. This is because there is less displacement at the edge portions of the resonator element and the vibration energy is concentrated on the central portion (vibrating portion) of the resonator element. Hence, even when the edge portions of the resonator element are bonded with bonding materials as shown by broken lines, the amplitude of the thickness-shear vibration is less likely to be attenuated.

As shown in FIG. 8B, in the flexural vibration mode, flexural displacement continuously occurs in the entire resonator element, and displacement occurs even at the edge portions of the resonator element. This is because the vibration energy propagates through the entire resonator element. Hence, the amplitude of the entire flexural vibration can be attenuated by bonding the edge portions of the resonator element with bonding materials as shown by broken lines. That is, the flexural vibration mode is remarkably affected by the bonding material.

It has been found through the second experimental example that, by properly setting the length Xp, the amplitude of the entire flexural vibration can be attenuated while making the amplitude of the thickness-shear vibration less likely to be attenuated (e.g., without attenuation). It can be said in the first experimental example that since the amplitude of the flexural vibration can be attenuated by setting the length Xp so as to satisfy Formulae (1) and (2) described above, the flexural vibration is less likely to couple to the thickness-shear vibration, the resonator can have favorable frequency-temperature characteristics, and the equivalent series resistance can be reduced.

3. RESONATOR DEVICE

Figure 9:
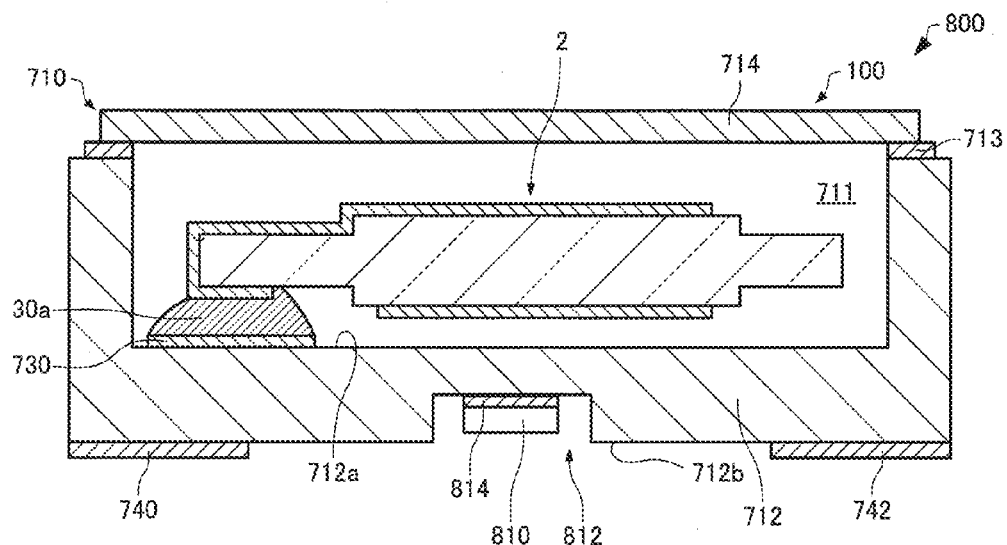
FIG. 9 is a cross-sectional view schematically showing a resonator device according to an embodiment.

Next, a resonator device according to an embodiment will be described with reference to the drawing. FIG. 9 is a cross-sectional view schematically showing the resonator device 800 according to the embodiment.

The resonator device 800 includes a resonator according to the invention. Hereinafter, the resonator device 800, which includes the resonator 100 as a resonator according to the invention, will be described. As shown in FIG. 9, the resonator device 800 includes the resonator 100 and a temperature-sensitive element (electronic element) 810.

The temperature-sensitive element 810 is provided in a recess 812 formed in the outer bottom surface 712b of the package 710. In the illustrated example, a third connection terminal 814 is provided in the recess 812, and the temperature-sensitive element 810 is bonded to the third connection terminal 814 via a metal bump (not shown) or the like. The third connection terminal 814 is connected to the external terminals 740 and 742 via, for example, the internal wiring (not shown) provided in the base substrate 712. The material of the third connection terminal 814 is, for example, the same as the material of the external terminals 740 and 742.

The temperature-sensitive element 810 is, for example, a thermistor in which a physical quantity, for example, an electrical resistance changes in response to changes in temperature. The electrical resistance of the thermistor is detected by an external circuit, so that the detected temperature of the thermistor can be measured.

In the recess 711 containing the resonator element 2, another electronic component may be accommodated. Examples of such an electronic component include an IC chip that controls the driving of the resonator 100.

The resonator device 800 includes the resonator 100, and thus can have favorable temperature characteristics.

4. MODIFIED EXAMPLE OF RESONATOR DEVICE

Figure 10:
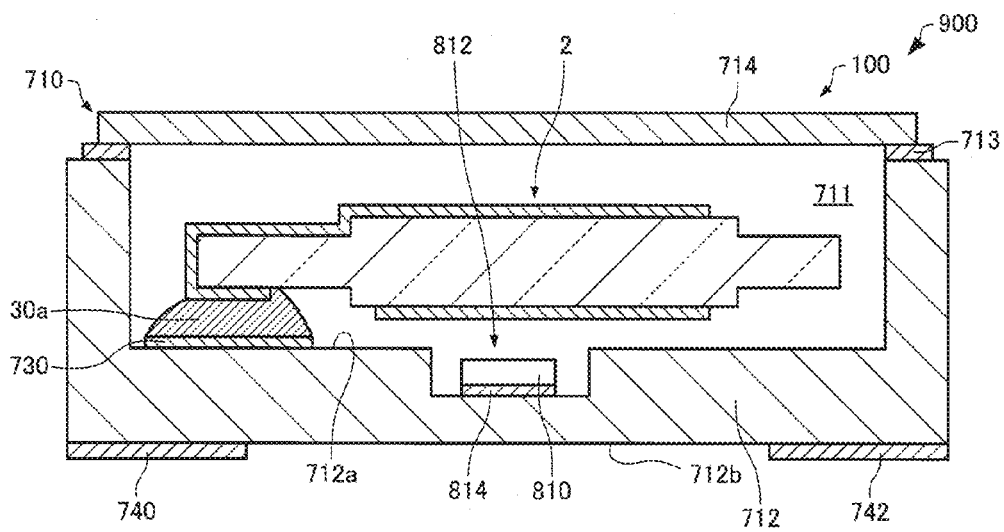
FIG. 10 is a cross-sectional view schematically showing a resonator device according to a modified example of the embodiment.

Next, a resonator device according to a modified example of the embodiment will be described with reference to the drawing. FIG. 10 is a cross-sectional view schematically showing the resonator device 900 according to the modified example of the embodiment.

Hereinafter, in the resonator device 900 according to the modified example of the embodiment, members having similar functions to those of the constituent members of the resonator device 800 according to the embodiment are denoted by the same reference numerals and signs, and the detailed description thereof is omitted.

In the resonator device 800 as shown in FIG. 9, the recess 812 containing the temperature-sensitive element 810 is provided in the outer bottom surface 712b of the package 710. In contrast, in the resonator device 900 as shown in FIG. 10, the recess 812 is provided in the inner bottom surface 712a of the package 710. The recess 812 is in communication with the recess 711.

The resonator device 900 includes the resonator 100, and thus can have favorable temperature characteristics.

5. OSCILLATOR

Figure 11:
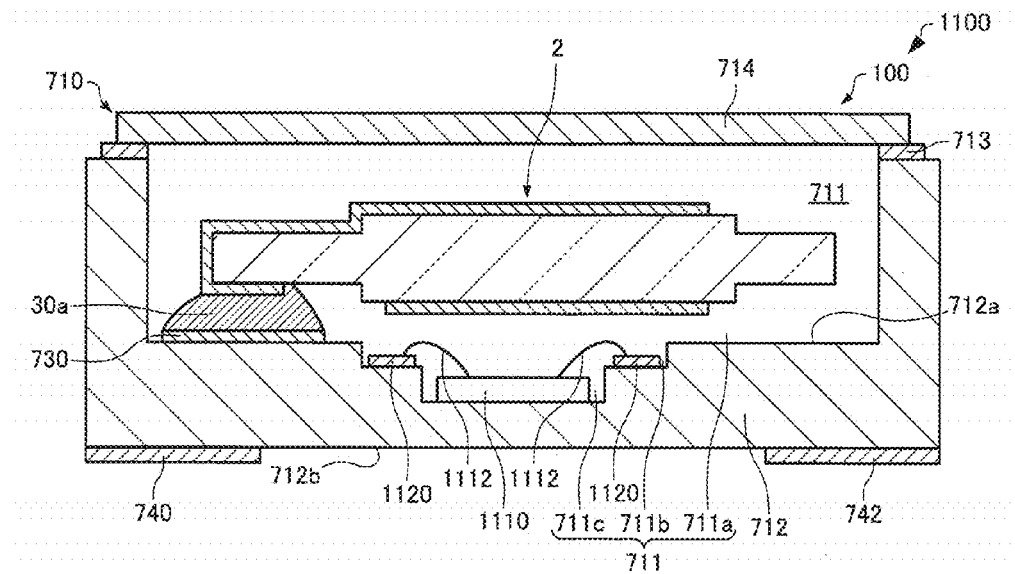
FIG. 11 is a cross-sectional view schematically showing an oscillator according to an embodiment.

Next, an oscillator according to an embodiment will be described with reference to the drawing. FIG. 11 is a cross-sectional view schematically showing the oscillator 1100 according to the embodiment.

The oscillator 1100 includes a resonator according to the invention. The oscillator 1100, which includes the resonator 100 as a resonator according to the invention, will be described below. As shown in FIG. 11, the oscillator 1100 includes the resonator 100 and an IC chip (chip component) 1110.

In the oscillator 1100, the recess 711 includes a first portion 711a provided on the inner bottom surface 712a of the package 710, a second portion 711b provided at the central portion of the bottom surface of the first portion 711a, and a third portion 711c provided at the central portion of the bottom surface of the second portion 711b.

The IC chip 1110 is provided on the bottom surface of the third portion 711c of the recess 711. The IC chip 1110 includes a drive circuit (oscillation circuit) for controlling the driving of the resonator 100. When the resonator 100 is driven by the IC chip 1110, vibration at a predetermined frequency can be extracted. The IC chip 1110 overlaps the resonator element 2 in the plan view.

A plurality of fourth connection terminals 1120 that are electrically connected with the IC chip 1110 via wires 1112 are provided on the bottom surface of the second portion 711b of the recess 711. For example, one fourth connection terminal 1120 of the plurality of fourth connection terminals 1120 is electrically connected with the first external terminal 740 via wiring (not shown). Another fourth connection terminal 1120 of the plurality of fourth connection terminals 1120 is electrically connected with the second external terminal 742 via wiring (not shown). Hence, the IC chip 1110 is electrically connected with the resonator 100.

The oscillator 1100 includes the resonator 100, and thus can have favorable temperature characteristics.

6. MODIFIED EXAMPLE OF OSCILLATOR

Figure 12:
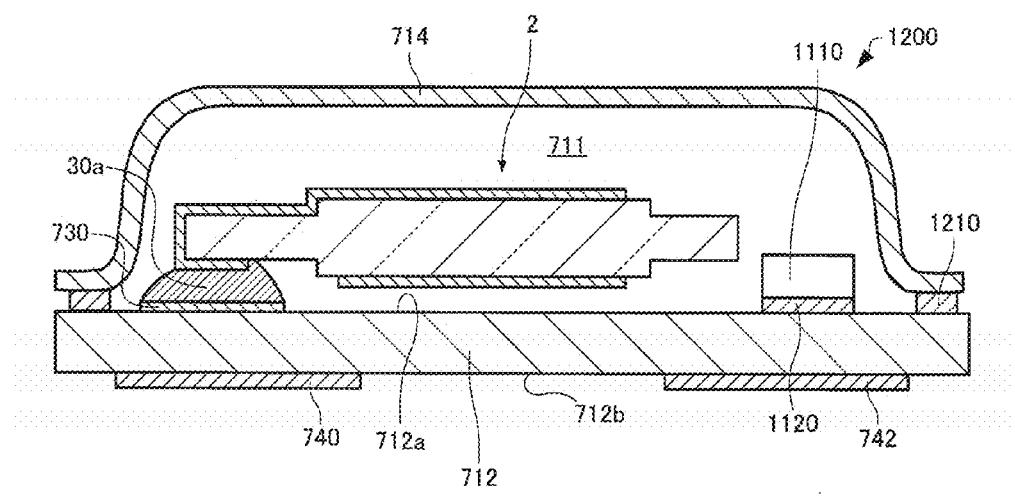
FIG. 12 is a cross-sectional view schematically showing an oscillator according to a modified example of the embodiment.

Next, an oscillator according to a modified example of the embodiment will be described with reference to the drawing. FIG. 12 is a cross-sectional view schematically showing the oscillator 1200 according to the modified example of the embodiment.

Hereinafter, in the oscillator 1200 according to the modified example of the embodiment, members having similar functions to those of the constituent members of the oscillator 1100 according to the embodiment are denoted by the same reference numerals and signs, and the detailed description thereof is omitted.

In the oscillator 1100 described above, the IC chip 1110 overlaps the resonator element 2 in the plan view as shown in FIG. 11. In contrast, in the oscillator 1200 as shown in FIG. 12, the IC chip 1110 does not overlap the resonator element 2 in the plan view. The IC chip 1110 is provided on the lateral side of the resonator element 2. The IC chip 1110 is provided on the fourth connection terminal 1120 via a metal bump or the like.

In the oscillator 1200, the package 710 includes the base substrate 712 having a plate shape and the lid 714 having a box shape and including the recess 711. The lid 714 is hermetically sealed by melting metallization 1210 provided at the peripheral portion of the base substrate 712. In this case, vacuum can be established in the interior by performing the sealing step in vacuum. As a means of sealing, a means in which the lid 714 is melted and welded using a laser beam or the like may be used.

The oscillator 1200 includes the resonator 100, and thus can have favorable temperature characteristics.

7. ELECTRONIC APPARATUSES

Next, electronic apparatuses according to an embodiment will be described with reference to the drawings. The electronic apparatuses according to the embodiment include a resonator according to the invention. The electronic apparatuses, which include the resonator 100 as a resonator according to the invention, will be described below.

Figure 13:
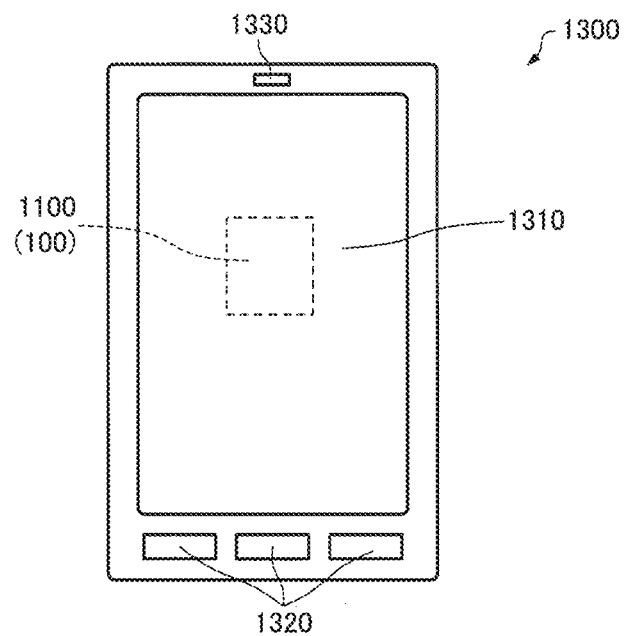
FIG. 13 is a plan view schematically showing an electronic apparatus according to an embodiment.

FIG. 13 is a plan view schematically showing a smartphone 1300 as an electronic apparatus according to the embodiment. As shown in FIG. 13, the smartphone 1300 includes the oscillator 1100 including the resonator 100.

The smartphone 1300 uses the oscillator 1100 as, for example, a timing device such as a reference clock oscillation source. The smartphone 1300 can further include a display portion (a liquid crystal display, an organic EL display, etc.) 1310, operating portions 1320, and a sound output portion 1330 (a microphone, etc.). The smartphone 1300 may be provided with a touch detecting mechanism for the display portion 1310, so that the display portion 1310 serves also as an operating portion.

The electronic apparatus represented by the smartphone 1300 preferably includes an oscillation circuit that drives the resonator 100 and a temperature compensation circuit that compensates for frequency variations associated with changes in the temperature of the resonator 100.

According to this configuration, since the electronic apparatus represented by the smartphone 1300 includes the oscillation circuit that drives the resonator 100 and the temperature compensation circuit that compensates for frequency variations associated with changes in the temperature of the resonator 100, the resonance frequency at which the oscillation circuit oscillates can be temperature-compensated, and thus it is possible to provide the electronic apparatus having excellent temperature characteristics.

Figure 14:
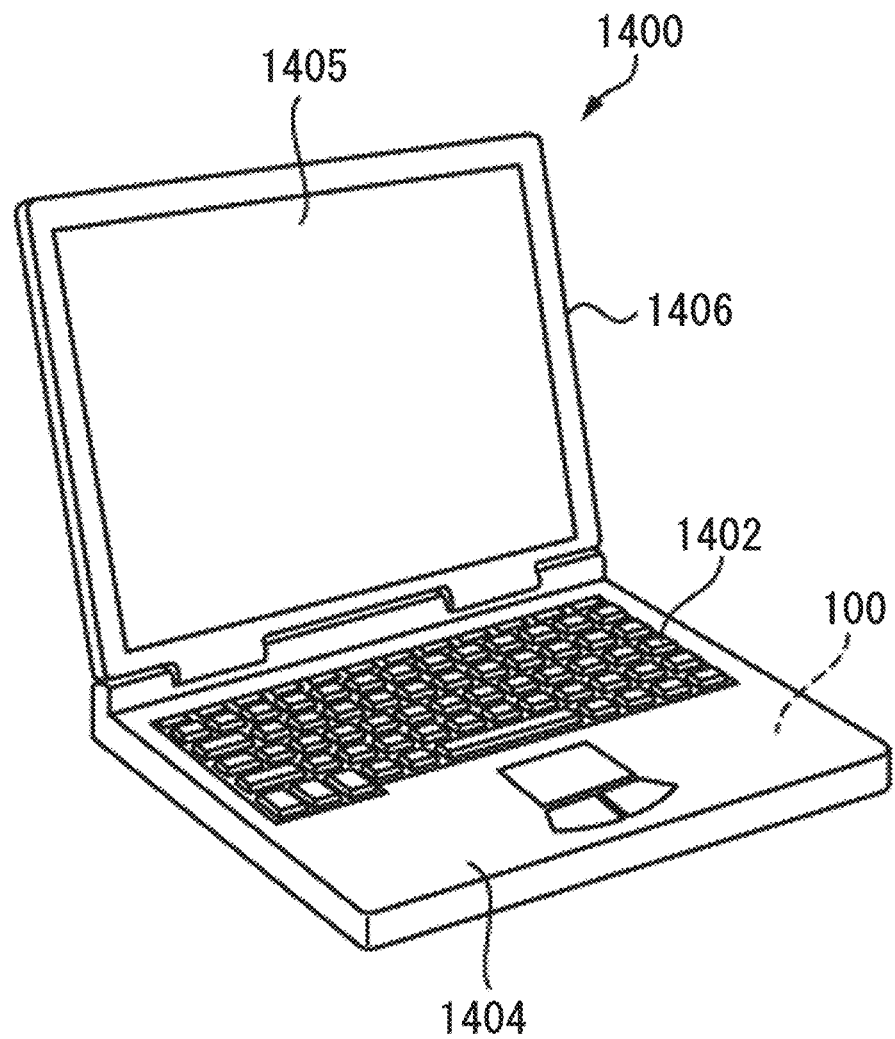
FIG. 14 is a perspective view schematically showing an electronic apparatus according to the embodiment.

FIG. 14 is a perspective view schematically showing a mobile (or notebook) personal computer 1400 as an electronic apparatus according to the embodiment. As shown in FIG. 14, the personal computer 1400 is composed of a main body portion 1404 including a keyboard 1402, and a display unit 1406 including a display portion 1405. The display unit 1406 is rotatably supported to the main body portion 1404 via a hinge structure portion. The resonator 100, which functions as a filter, a resonator, a reference clock, or the like, is incorporated into the personal computer 1400.

Figure 15:
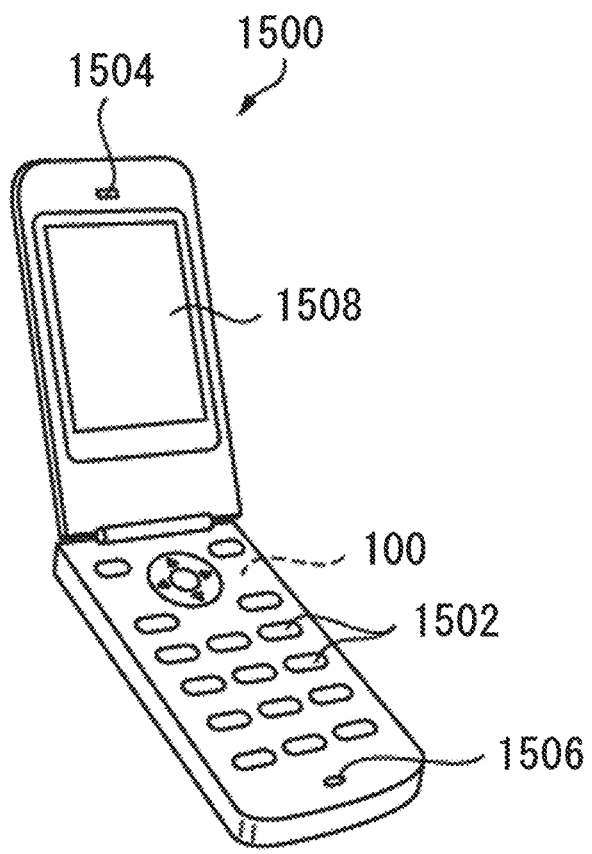
FIG. 15 is a perspective view schematically showing an electronic apparatus according to the embodiment.

FIG. 15 is a perspective view schematically showing a mobile phone (including a PHS) 1500 as an electronic apparatus according to the embodiment. The mobile phone 1500 includes a plurality of operating buttons 1502, an earpiece 1504, and a mouthpiece 1506. A display portion 1508 is disposed between the operating buttons 1502 and the earpiece 1504. The resonator 100, which functions as a filter, a resonator, or the like, is incorporated into the mobile phone 1500.

Figure 16:
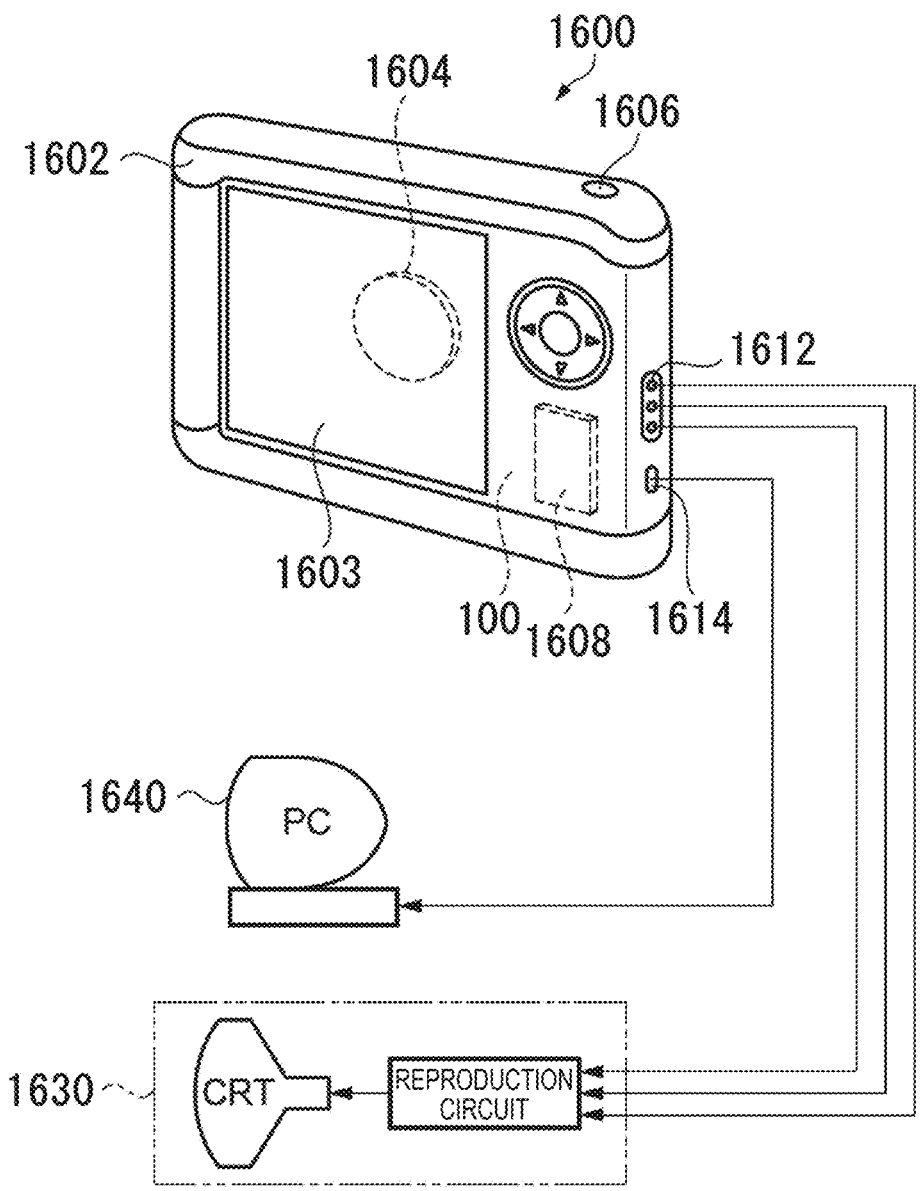
FIG. 16 is a perspective view schematically showing an electronic apparatus according to the embodiment.

FIG. 16 is a perspective view schematically showing a digital still camera 1600 as an electronic apparatus according to the embodiment. In FIG. 16, connections with external apparatuses are also shown in a simplified manner. Here, usual cameras expose a silver halide photographic film with an optical image of a subject, whereas the digital still camera 1600 photoelectrically converts the optical image of the subject with an imaging device such as a CCD (Charge Coupled Device) to generate imaging signals (image signals).

A display portion 1603 is provided on the back surface of a case (body) 1602 in the digital still camera 1600, and configured to perform display based on the imaging signals generated by the CCD. The display portion 1603 functions as a finder that displays the subject as an electronic image. Moreover, on the front side (the rear side in the drawing) of the case 1602, a light receiving unit 1604 including an optical lens (imaging optical system) and the CCD is provided.

When a photographer confirms the subject image displayed on the display portion and presses down a shutter button 1606, imaging signals of the CCD at the time are transferred to and stored in a memory 1608. In the digital still camera 1600, a video signal output terminal 1612 and a data communication input/output terminal 1614 are provided on a side surface of the case 1602. Then, as shown in the drawing, a television monitor 1630 and a personal computer 1640 are connected as necessary to the video signal output terminal 1612 and the data communication input/output terminal 1614, respectively. Further, the imaging signals stored in the memory 1608 are output to the television monitor 1630 or the personal computer 1640 by a predetermined operation. The resonator 100, which functions as a filter, a resonator, or the like, is incorporated into the digital still camera 1600.

The electronic apparatuses 1300, 1400, 1500, and 1600 include the resonator 100, and thus can have favorable temperature characteristics.

An electronic apparatus including a resonator according to the invention is not limited to the examples described above, and can be applied to, for example, an inkjet ejection device (e.g., an inkjet printer), a laptop personal computer, a television set, a video camcorder, a video tape recorder, a car navigation system, a pager, an electronic notebook (including one with communication function), an electronic dictionary, a calculator, an electronic game console, a word processor, a workstation, a videophone, a surveillance television monitor, electronic binoculars, a POS terminal, a medical device (e.g., an electronic thermometer, a sphygmomanometer, a blood glucose meter, an electrocardiogram measuring system, an ultrasonic diagnosis apparatus, and an electronic endoscope), a fishfinder, various types of measuring instrument, indicators (e.g., indicators used in a vehicle, aircraft, and a ship), and a flight simulator.

8. MOVING OBJECT

Figure 17:
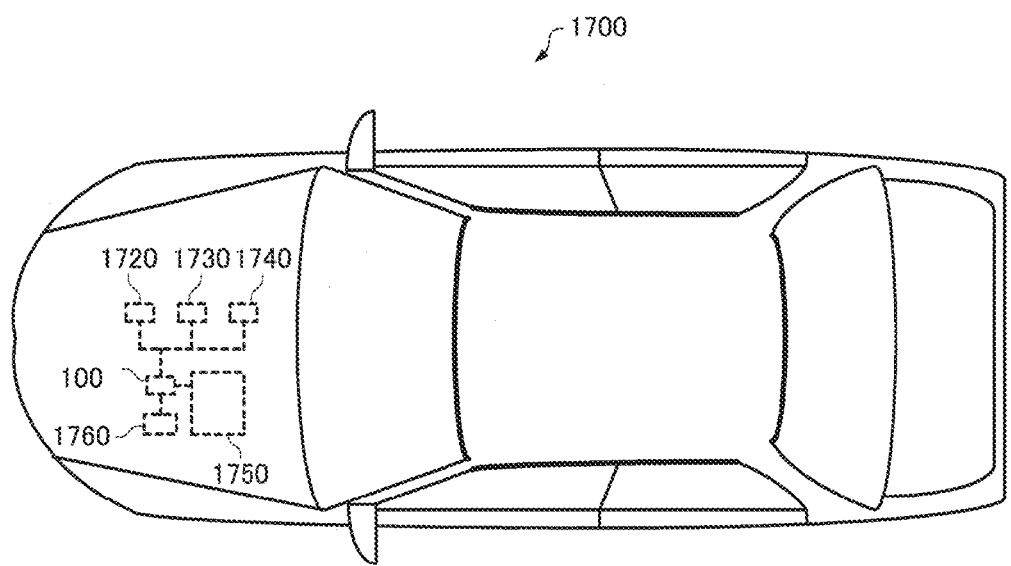
FIG. 17 is a plan view schematically showing a moving object according to an embodiment.

Next, a moving object according to an embodiment will be described with reference to the drawing. FIG. 17 is a perspective view schematically showing an automobile as the moving object 1700 according to the embodiment.

The moving object according to the embodiment includes a resonator according to the invention. The moving object, which includes the resonator 100 as a resonator according to the invention, will be described below.

The moving object 1700 according to the embodiment is configured to further include a controller 1720, a controller 1730, and a controller 1740 that perform various kinds of control such as for an engine system, a brake system, and a keyless entry system, a battery 1750, and a backup battery 1760. A portion of the components (parts) shown in FIG. 17 may be omitted or changed in the moving object 1700 according to the embodiment, or another component may be added to the components.

Various types of moving objects are considered as the moving object 1700, and examples thereof include, for example, an automobile (including an electric car), aircraft such as a jet plane or a helicopter, a ship, a rocket, and an artificial satellite.

The moving object 1700 includes the resonator 100, and thus can have favorable temperature characteristics.

The embodiments and modified examples described above are merely examples, and the invention is not limited to these examples. For example, each of the embodiments and each of the modified examples can be appropriately combined together.

The invention includes a configuration (e.g., a configuration having the same function, method, and result, or a configuration having the same advantage and advantageous effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No. 2015-028432, filed Feb. 17, 2015 is expressly incorporated by reference herein.

What is claimed is:

1. A resonator comprising:
a resonator element including a quartz crystal substrate that includes a first area performing a thickness-shear vibration and a second area with a thickness thinner than the first area and located around the first area; and
a base substrate to which the second area of the resonator element on one edge side thereof is attached via a bonding material, wherein
in an orthogonal coordinate system composed of an X-axis as an electrical axis, a Y-axis as a mechanical axis, and a Z-axis as an optic axis that are crystal axes of quartz crystal, the quartz crystal substrate has a Z'-axis that is an axis obtained by inclining the Z-axis such that a +Z-side thereof rotates about the X-axis toward a −Y-direction of the Y-axis, a Y'-axis that is an axis obtained by inclining the Y-axis such that a +Y-side thereof rotates about the X-axis toward a +Z-direction of the Z-axis, a major surface that is a surface including the X-axis and the Z'-axis, and a thickness in a direction along the Y'-axis,
the resonator element includes an electrode pad located in one end of the second area of the resonator element,
in a plan view, the area where the bonding material is bonded overlaps with the electrode pad and also with a portion of the end of the second area which does not include the electrode pad,
the resonator satisfies the relation:

$$1.5 \times \lambda \leq Xp$$

where Xp is the maximum length of an area of the second area where the bonding material is bonded along the X-axis in a plan view and λ is the wavelength of a flexural vibration occurring in the quartz crystal substrate, and
the resonator satisfies the relation:

$$\lambda/2 \leq Lx$$

where Lx is the minimum length along the X-axis between an edge of the area of the second area where the bonding material is bonded on the first area side and an edge of the first area on the bonding material side in the plan view.

2. The resonator according to claim 1, satisfying the relation:

$$2 \times \lambda \leq Xp.$$

3. A resonator device comprising:
the resonator according to claim 2; and
an electronic element.

4. The resonator device according to claim 3, wherein the electronic element is a temperature-sensitive element.

5. An oscillator comprising:
the resonator according to claim 2; and
an oscillation circuit electrically connected with the resonator.

6. The resonator according to claim 1, wherein the first area and the second area form a one-stage mesa structure.

7. The resonator according to claim 1, wherein the first area and the second area form a one-stage mesa.

8. The resonator according to claim 1, further comprising an excitation electrode disposed in the first area.

9. The resonator according to claim 1, further comprising an excitation electrode disposed in the first area.

10. A resonator device comprising:
the resonator according to claim 1; and
an electronic element.

11. The resonator device according to claim 10, wherein the electronic element is a temperature-sensitive element.

12. An oscillator comprising:
the resonator according to claim 1; and
an oscillation circuit electrically connected with the resonator.

13. An electronic apparatus comprising the resonator according to claim 1.

14. A moving object comprising the resonator according to claim 1.

* * * * *